United States Patent
Nakazawa et al.

(10) Patent No.: US 11,714,203 B2
(45) Date of Patent: Aug. 1, 2023

(54) X-RAY IMAGING PANEL AND METHOD FOR FABRICATING THE SAME

(71) Applicant: Sharp Display Technology Corporation, Kameyama (JP)

(72) Inventors: Makoto Nakazawa, Kameyama (JP); Rikiya Takita, Kameyama (JP); Fumiki Nakano, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 17/718,711

(22) Filed: Apr. 12, 2022

(65) Prior Publication Data

US 2022/0342092 A1 Oct. 27, 2022

(30) Foreign Application Priority Data

Apr. 22, 2021 (JP) .................................. 2021-072763

(51) Int. Cl.
*G01T 1/24* (2006.01)
*H01L 27/146* (2006.01)

(52) U.S. Cl.
CPC .............. *G01T 1/241* (2013.01); *G01T 1/248* (2013.01); *H01L 27/1462* (2013.01); *H01L 27/14663* (2013.01)

(58) Field of Classification Search
CPC ..... G01T 1/241; G01T 1/248; H01L 27/1462; H01L 27/14663
See application file for complete search history.

(56) References Cited

U.S. PATENT DOCUMENTS

| | | | | |
|---|---|---|---|---|
| 4,050,453 | A | * | 9/1977 | Castillo .................... A61B 5/25 600/391 |
| 5,892,227 | A | * | 4/1999 | Schieber ........... H01L 27/14665 257/E31.026 |
| 2005/0017189 | A1 | * | 1/2005 | Homma ................ G01T 1/2018 250/370.11 |
| 2006/0033030 | A1 | * | 2/2006 | Ito ........................ G01T 1/2018 250/370.11 |
| 2008/0099869 | A1 | * | 5/2008 | Izumi ................ H01L 27/14618 257/443 |
| 2011/0147596 | A1 | * | 6/2011 | Ishida ............... H01L 27/14663 250/366 |
| 2011/0180716 | A1 | * | 7/2011 | Okada .................... G01T 1/243 250/370.08 |

(Continued)

FOREIGN PATENT DOCUMENTS

JP 2019-134009 A 8/2019

*Primary Examiner* — Blake C Riddick
(74) *Attorney, Agent, or Firm* — ScienBiziP, P.C.

(57) ABSTRACT

According to an aspect, an active matrix substrate of an X-ray imaging panel includes: an active matrix substrate having a pixel region including a plurality of pixels; and a scintillator that converts X-rays projected onto the X-ray imaging panel to scintillation light. The plurality of pixels include respective photoelectric conversion elements. The active matrix substrate further includes a first planarizing film that covers the photoelectric conversion elements, is formed from an organic resin film, and has a plurality of first contact holes and a first wiring line that is formed in the first contact holes and in a layer upper than the first planarizing film and connected to the photoelectric conversion elements within the first contact holes.

8 Claims, 7 Drawing Sheets

(56) References Cited

U.S. PATENT DOCUMENTS

| | | | | |
|---|---|---|---|---|
| 2011/0186742 A1* | 8/2011 | Okada | ................... | H04N 5/32 |
| | | | | 250/370.08 |
| 2013/0001427 A1* | 1/2013 | Okada | ................... | H01L 27/00 |
| | | | | 250/370.09 |
| 2013/0140568 A1* | 6/2013 | Miyamoto | ........ | H01L 27/14603 |
| | | | | 257/53 |
| 2014/0084175 A1* | 3/2014 | Ito | ............. | G01T 1/24 |
| | | | | 250/370.09 |
| 2015/0153464 A1* | 6/2015 | Imamura | ................ | A61B 6/58 |
| | | | | 378/207 |
| 2015/0192684 A1* | 7/2015 | Ito | ............. | G01T 1/20 |
| | | | | 250/361 R |
| 2016/0336373 A1* | 11/2016 | Gao | ................ | H01L 27/14612 |
| 2017/0045629 A1* | 2/2017 | Antonuk | ................ | G01T 1/241 |
| 2018/0138205 A1* | 5/2018 | Miyamoto | .......... | H01L 21/3205 |
| 2018/0329084 A1* | 11/2018 | Karim | ................... | G01T 1/247 |
| 2019/0123080 A1* | 4/2019 | Kanicki | ............. | H10K 19/20 |
| 2019/0189673 A1* | 6/2019 | Misaki | ................ | H01L 27/1288 |
| 2019/0237692 A1 | 8/2019 | Nakazawa et al. | | |
| 2019/0296065 A1* | 9/2019 | Misaki | ................ | G01T 1/2018 |
| 2019/0355774 A1* | 11/2019 | Misaki | ............. | H01L 27/14612 |
| 2020/0091221 A1* | 3/2020 | Nakazawa | ........ | H01L 27/14614 |
| 2020/0091222 A1* | 3/2020 | Nakazawa | ........ | H01L 27/14614 |

* cited by examiner

X-RAY IMAGING PANEL AND METHOD FOR FABRICATING THE SAME

CROSS-REFERENCE TO RELATED APPLICATIONS

This application claims the benefit of priority to Japanese Patent Application Number 2021-072763 filed on Apr. 22, 2021. The entire contents of the above-identified application are hereby incorporated by reference.

BACKGROUND

The present disclosure relates to an X-ray imaging panel and a method for fabricating the same.

TECHNICAL FIELD

An X-ray imaging panel in which a planarizing film formed on an active matrix substrate is formed in a pixel region and a portion outside the pixel region is a known art, and a method for fabricating the X-ray imaging panel is also a known art. Such an X-ray imaging panel and a method for fabricating the same are disclosed in, for example, Japanese Unexamined Patent Application Publication No. 2019-134009.

In the X-ray imaging panel in Japanese Unexamined Patent Application Publication No. 2019-134009, a photoelectric conversion element, a first planarizing film that covers the photoelectric conversion element and formed from an organic resin film, and a first inorganic insulating film that covers the first inorganic insulating film are provided for each pixel. In each pixel, a bias line is formed between the first planarizing film and the first inorganic insulating film. The first planarizing film and the first inorganic insulating film are formed in the pixel region and extend to a portion outside the pixel region of the active matrix substrate. In the portion outside the pixel region, the first planarizing film is covered with the first inorganic insulating film. An outer edge of the first planarizing film in the active matrix substrate is located inward of a position at which the active matrix substrate is to be cut.

In the X-ray imaging panel in Japanese Unexamined Patent Application Publication No. 2019-134009, since the first planarizing film is not formed at the position at which the active matrix substrate is to be cut, the thickness of the active matrix substrate at the cutting position is small, and the active matrix substrate can be easily cut. This improves the yield of the active matrix substrate. However, in the X-ray imaging panel in Japanese Unexamined Patent Application Publication No. 2019-134009, a step is formed at the outer edge of the first planarizing film. Therefore, when the bias line is formed (during a step including photolithography), light for exposure does not easily reach a bottom portion of the step, so that the resist may remain in part of the step. In this case, unintended discharge (hereinafter referred to as "anomalous discharge") occurs during dry etching because of a small amount of metal remaining in the step or removal of metal at unintended timing due to the unintendedly remaining resist. The anomalous discharge may reach the bias line and the photoelectric conversion elements disposed in the pixels, disadvantageously causing damage to wiring lines such as the bias line and the photoelectric conversion elements (elements disposed in the pixels).

It is desirable to provide an X-ray imaging panel in which damage to the wiring lines and elements in the active matrix substrate due to the occurrence of anomalous discharge during fabrication of the active matrix substrate can be reduced and to provide a method for fabricating the X-ray imaging panel.

SUMMARY

According to an aspect of the disclosure, there is provided an X-ray imaging panel including: an active matrix substrate having a pixel region including a plurality of pixels; and a scintillator that converts X-rays projected onto the X-ray imaging panel to scintillation light, wherein the plurality of pixels include respective photoelectric conversion elements, wherein the active matrix substrate further includes a first planarizing film that covers the photoelectric conversion elements, is formed from an organic resin film, and has a plurality of first contact holes and a first wiring line that is formed in the first contact holes and in a layer upper than the first planarizing film and connected to the photoelectric conversion elements within the first contact holes, wherein the first planarizing film is disposed in the active matrix substrate so as to extend to an outer portion outside the pixel region, and wherein the active matrix substrate further includes, in the outer portion, a first conductive portion formed in the same layer as the layer in which the first wiring line is formed and a second wiring line disposed in a layer lower than the first conductive portion and connected to the first conductive portion.

According to another aspect of the disclosure, there is provided a method for fabricating an X-ray imaging panel that includes an active matrix substrate having a pixel region including a plurality of pixels and a scintillator that converts X-rays projected onto the X-ray imaging panel to scintillation light, the method including: forming a plurality of photoelectric conversion elements in the pixel region; forming a first planarizing film formed from an organic resin film such that the first planarizing film covers the plurality of photoelectric conversion elements and extends from the pixel region to an outer portion outside the pixel region; forming a plurality of first contact holes in the first planarizing film; and forming, in the pixel region, a first wiring line in the first contact holes and in a layer upper than the first planarizing film and forming, in the outer portion, a first conductive portion in the same layer as the layer in which the first wiring line is formed, wherein the forming the first wiring line and the first conductive portion includes performing dry etching by photolithography and further includes forming a second wiring line in a layer lower than the first conductive portion.

DESCRIPTION OF THE EMBODIMENTS

Figure 1:
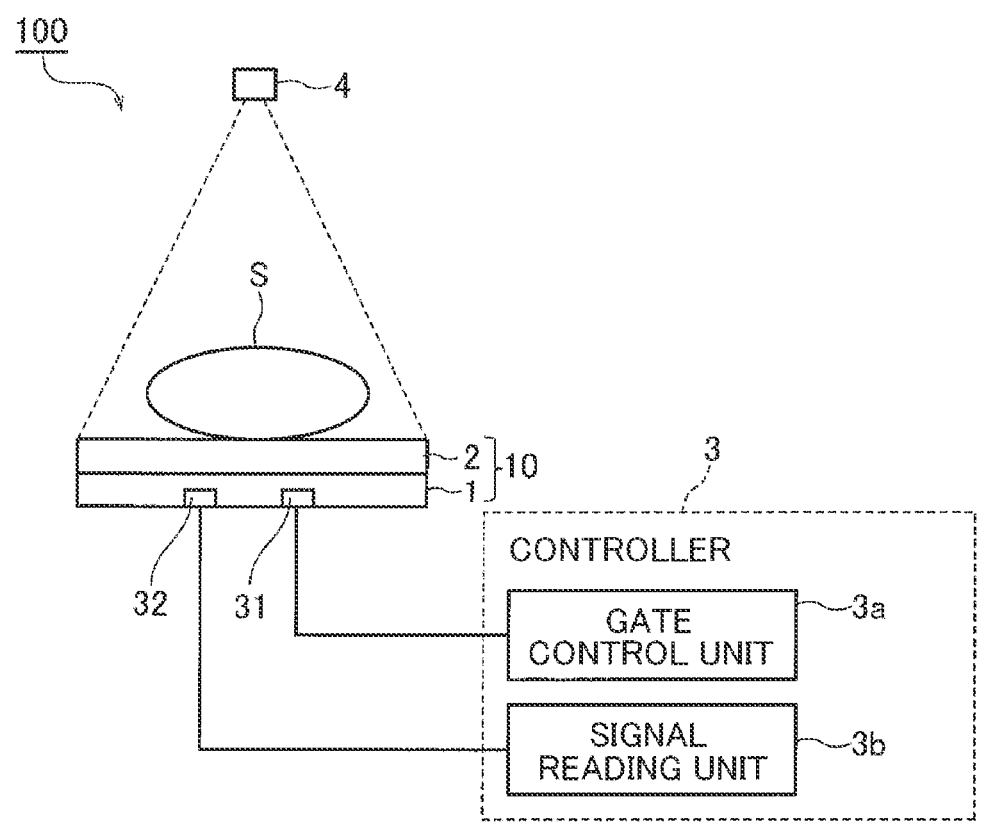
FIG. 1 is a schematic illustration showing the structure of an X-ray imaging device according to a first embodiment.

Embodiments of the present disclosure will be described in detail with reference to the drawings. In the drawings, the same or corresponding portions are denoted by the same reference symbols, and description thereof will not be repeated. In the following drawings, a simplified or schematic structure is shown, or part of components are omitted for the sake of convenience of the description. Moreover, the dimensional ratios of components in the drawings do not necessarily coincide with the actual dimensional ratios.

First Embodiment

FIG. 1 is a schematic illustration showing an X-ray imaging device 100 including an X-ray imaging panel 10 in a first embodiment. The X-ray imaging device 100 includes: the X-ray imaging panel 10 including an active matrix substrate 1 and a scintillator 2; a controller 3; and an X-ray source 4. The controller 3 includes a gate control unit 3a and a signal reading unit 3b. The controller 3 includes a processor that performs various types of processing for controlling the X-ray imaging device 100.

The X-ray source 4 irradiates a subject S with X rays. The X rays passing through the subject S are converted to fluorescence (hereinafter referred to as scintillation light) in the scintillator 2 disposed on an upper portion of the active matrix substrate 1. The active matrix substrate 1 converts the scintillation light to electric signals. The X-ray imaging device 100 captures an image of the scintillation light in the active matrix substrate 1 and acquires an X-ray image using the controller 3. The terms "upper," "above," and "upper portion" mean a direction toward the scintillator 2 (a light incident side) when the X-ray imaging device 100 is viewed from the active matrix substrate 1 side, and the terms "lower," "below," and "lower portion" mean the side opposite to the scintillator 2 of the active matrix substrate 1.

Figure 2:
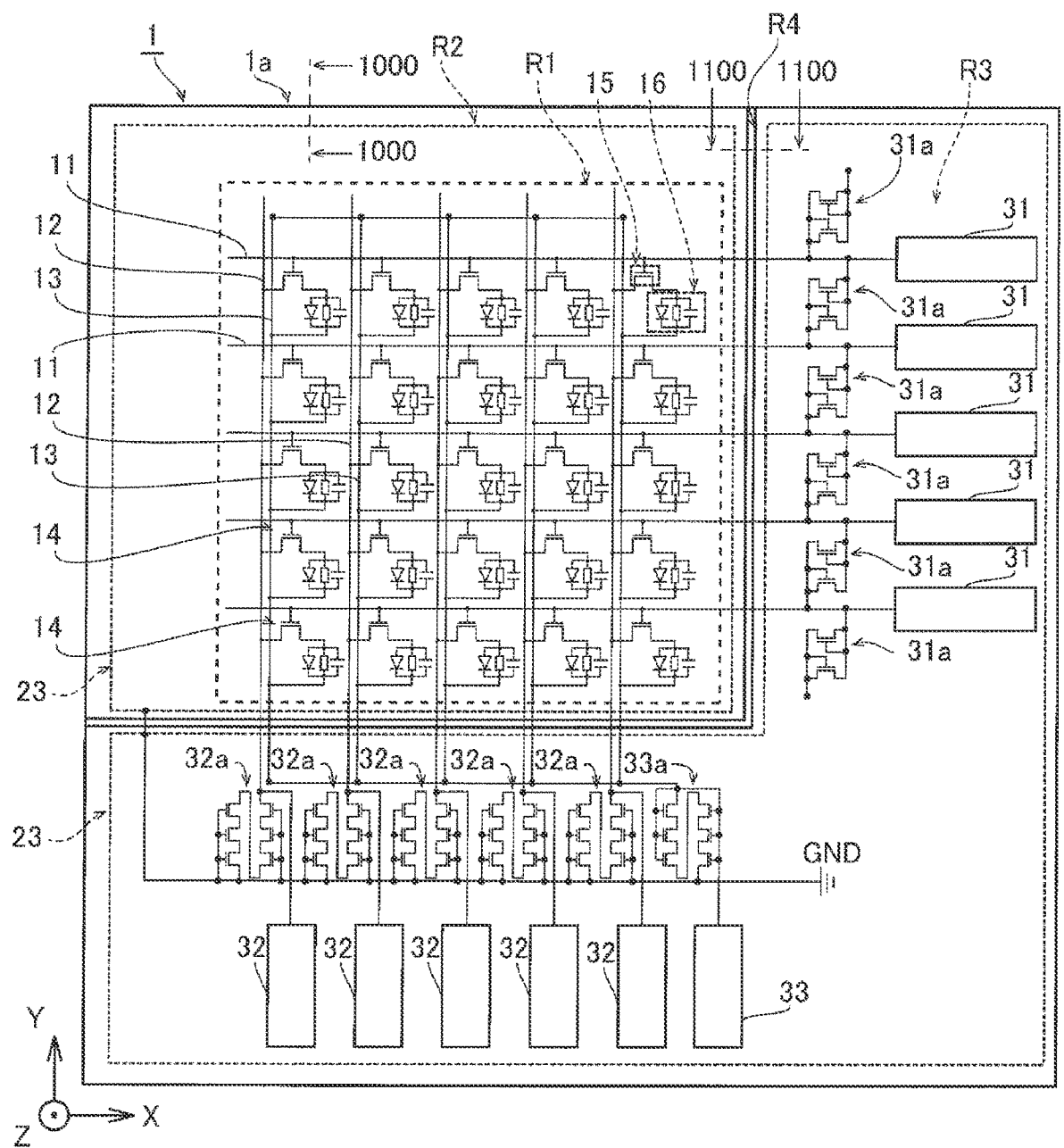
FIG. 2 is a schematic plan view of an active matrix substrate.

FIG. 2 is a schematic plan view showing a schematic structure of the active matrix substrate 1. The active matrix substrate 1 includes a plurality of gate lines 11, a plurality of data lines 12, and a bias line 13. The plurality of gate lines 11 and the plurality of data lines 12 are arranged in a lattice pattern. A plurality of pixels 14 partitioned by the plurality of gate lines 11 and the plurality of data lines 12 are provided in the active matrix substrate 1. A region of the active matrix substrate 1 in which the plurality of pixels 14 are formed is referred to as a "pixel region R1."

Figure 3:
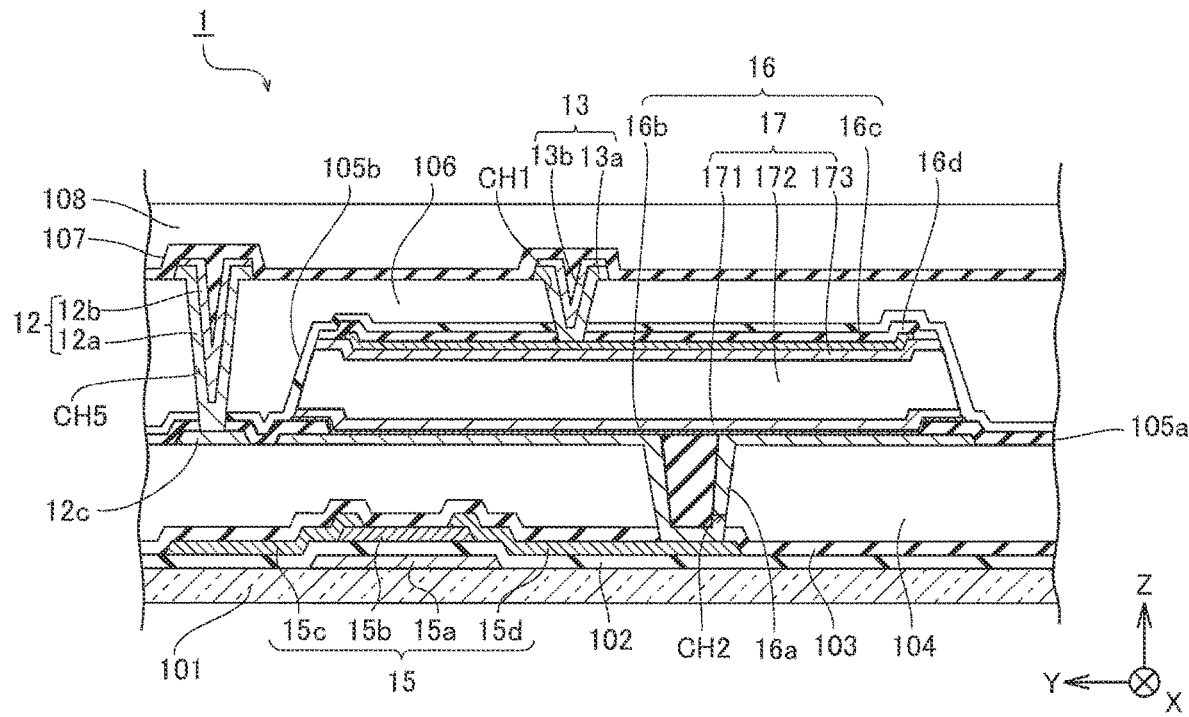
FIG. 3 is a cross-sectional view of the active matrix substrate in a pixel region.

Each of the pixels 14 of the active matrix substrate 1 includes a thin film transistor 15 and a photodiode 16. FIG. 3 is a cross-sectional view of the active matrix substrate 1 in the pixel region R1. As shown in FIG. 3, the photodiode 16 includes a photoelectric conversion layer 17 that converts the scintillation light converted from the X rays passing through the subject S (see FIG. 1) to electric charges (an electric signal) based on the light amount. The photodiode 16 is connected to the bias line 13 formed in a contact hole CH1.

The controller 3 (see FIG. 1) applies a voltage to the bias line 13. The gate control unit 3a sequentially turns on the thin film transistors 15 connected to the gate lines 11. When the thin film transistors 15 are turned on, signals corresponding to charges converted in the photodiodes 16 are outputted to the signal reading unit 3b through the data lines 12.

(Detailed Structure of Active Matrix Substrate)
<Structure of Pixel Region>

Referring to FIG. 3, the structure of the active matrix substrate 1 in the pixel region R1 will be described. As shown in FIG. 3, each of the thin film transistors 15 in the active matrix substrate 1 includes a gate electrode 15a connected to a corresponding gate line 11, a semiconductor active layer 15b, a source electrode 15c connected to a corresponding data line 12, and a drain electrode 15d connected to a corresponding photodiode 16. The photodiode 16 includes, in addition to the photoelectric conversion layer 17, a connection electrode 16a, a cathode 16b, and an anode 16c. The photoelectric conversion layer 17 is disposed between the cathode 16b and the anode 16c. The drain electrode 15d is connected to the cathode 16b through the connection electrode 16a disposed in a contact hole CH2.

Part of the data lines 12 are formed in contact holes CH5 and connected to connection electrodes 12c through the contact holes CH5. Each of the data lines 12 includes a data lower electrode 12a and a data upper electrode 12b that covers the data lower electrode 12a. The bias line 13 includes bias lower electrodes 13a at least partially formed in the contact holes CH1 and bias upper electrodes 13b formed on the bias lower electrodes 13a. The bias line 13 is connected to the anodes 16c of the photodiodes 16 in the contact holes CH1. Although not shown in FIG. 3, each source electrode 15c is connected to a corresponding data line 12 through a corresponding data connection electrode 12c.

As shown in FIG. 3, each gate electrode 15a is formed on a substrate 101. The substrate 101 is, for example, an insulating glass substrate. The gate electrode 15a is formed as, for example, a stacked film containing tungsten (W) and tantalum nitride (TaN) as its materials. A gate insulating film 102 is disposed so as to cover the gate electrode 15a. The gate insulating film 102 includes an upper insulating film formed of silicon oxide ($SiO_2$) and a lower insulating film formed of silicon nitride ($SiN_x$) that are stacked together.

The semiconductor active layer 15b, together with the source electrode 15c and the drain electrode 15d connected to the semiconductor active layer 15b, is formed on the gate electrode 15a with the gate insulating film 102 interposed therebetween. The semiconductor active layer 15b is formed of an oxide semiconductor. The oxide semiconductor is, for example, an amorphous oxide semiconductor containing indium (In), gallium (Ga), and zinc (Zn) at a prescribed ratio. With the above structure, an off-leakage current in the thin film transistor 15 can be smaller than that when amorphous silicon (a-Si) is used. When the off-leakage current in the thin film transistor 15 is small, a high-sensitivity sensor panel can be obtained, and the amount of exposure of the active matrix substrate 1 obtained can be reduced. The material of the semiconductor active layer 15b is not limited to the above materials. Amorphous oxide semiconductors such as $InGaO_3(ZnO)_5$, magnesium zinc oxide ($Mg_xZn_{1-x}O$), cadmium zinc oxide ($Cd_xZn_{1-x}O$), cadmium oxide (CdO), InSnZnO (containing In(indium), Sn(tin), and Zn(zinc)) and In(indium)-Al(aluminum)-Zn(zinc)-O(oxygen)-based amorphous oxide semiconductors may be used. "Amorphous" materials and "crystalline" materials (including polycrystalline, microcrystalline, and c-axis aligned materials) can also be used as the oxide semiconductor.

The source electrode 15c and the drain electrode 15d are disposed on the gate insulating film 102 so as to be in contact with part of the semiconductor active layer 15b. The source electrode 15c and the drain electrode 15d are formed in the same layer. The source electrode 15c and the drain electrode 15d each have, for example, a three-layer structure including two titanium (Ti)-made metal films and an aluminum (Al)-made metal film sandwiched therebetween.

As shown in FIG. 3, a protective film 103 is disposed on the gate insulating film 102 so as to cover the source electrode 15c and the drain electrode 15d. The contact hole CH2 is formed in the protective film 103 at a position above the drain electrode 15d. The protective film 103 is formed of, for example, silicon oxide ($SiO_2$).

A second planarizing film 104 is disposed on the protective film 103. Specifically, the second planarizing film 104 is formed in a layer upper than the thin film transistor 15. Therefore, the second planarizing film 104 covers at least part of the thin film transistor 15 to planarize the upper portion of the thin film transistor 15. The contact hole CH2 is formed in the second planarizing film 104 at a position above the drain electrode 15d. The second planarizing film 104 is formed from an organic insulating film containing a resin material (organic material).

The connection electrode 16a is formed on the second planarizing film 104. The connection electrode 16a is formed also in the contact hole CH2 to connect the drain electrode 15d to the cathode 16b. The connection electrode 16a has, for example, a three-layer structure including two titanium (Ti)-made metal films and an aluminum (Al)-made metal film sandwiched therebetween. Since the connection electrode 16a contains aluminum having a relatively small electrical resistance value, the electrical resistance value of the connection electrode 16a is relatively low. The data connection electrode 12c is formed on the second planarizing film 104 and located in the same layer as the layer in which the connection electrode 16a is formed.

A first inorganic insulating film 105a is formed on the connection electrode 16a and the data connection electrode 12c and in the contact hole CH2. The contact hole CH5 is provided in the first inorganic insulating film 105a at a position above the data connection electrode 12c, and part of the data lower electrode 12a is disposed in the contact hole CH5. The first inorganic insulating film 105a is formed of, for example, silicon nitride ($SiN_x$) or silicon dioxide ($SiO_2$).

The cathode 16b of the photodiode 16 is formed on the connection electrode 16a so as to cover the contact hole CH2 and part of the first inorganic insulating film 105a. The cathode 16b and the connection electrode 16a are in contact with each other. The cathode 16b is formed of, for example, titanium (Ti).

The photoelectric conversion layer 17 is formed on the cathode 16b. The photoelectric conversion layer 17 includes an n-type amorphous semiconductor layer 171, an intrinsic amorphous semiconductor layer 172, and a p-type amorphous semiconductor layer 173 that are stacked in this order. The n-type amorphous semiconductor layer 171 is formed of amorphous silicon doped with an n-type impurity (such as phosphorus). The intrinsic amorphous semiconductor layer 172 is formed of intrinsic amorphous silicon. The intrinsic amorphous semiconductor layer 172 is formed in contact with the n-type amorphous semiconductor layer 171. The p-type amorphous semiconductor layer 173 is formed of amorphous silicon doped with a p-type impurity (such as boron). The p-type amorphous semiconductor layer 173 is formed in contact with the intrinsic amorphous semiconductor layer 172. The anode 16c is formed on the photoelectric conversion layer 17. The anode 16c is formed of, for example, ITO (Indium Tin Oxide). An anode protective film 16d is formed so as to cover the anode 16c. The contact hole CH1 in which part of the bias line 13 is disposed is formed in the anode protective film 16d. The anode protective film 16d is formed as an inorganic insulating film and made of silicon nitride ($SiN_x$) or silicon dioxide ($SiO_2$).

A second inorganic insulating film 105b is formed so as to cover at least part of the photodiode 16 and the first inorganic insulating film 105a. The second inorganic insulating film 105b covers part of the upper surface of the photodiode 16 and its side surfaces. The contact holes CH1 and CH5 are formed in the second inorganic insulating film 105b. The second inorganic insulating film 105b is, for example, formed as an inorganic insulating film and made of silicon nitride ($SiN_x$).

A first planarizing film 106 is formed in a layer upper than the photodiode 16 so as to cover the second inorganic insulating film 105b. The first planarizing film 106 covers the photodiode 16 and planarizes step portions formed by the photodiode 16. The first planarizing film 106 is formed of, for example, the same material as the material of the second planarizing film 104 (an organic insulating film). The contact holes CH1 and CH5 are formed in the first planarizing film 106.

The data lower electrode 12a and the data upper electrode 12b are stacked in the contact hole CH5 in the first planarizing film 106. The bias lower electrode 13a and the bias upper electrode 13b are stacked in the contact hole CH1 in the first planarizing film 106. The data line 12 and the data connection electrode 12c are connected to each other in the contact hole CH5. The bias line 13 and the photodiode 16 are connected to each other in the contact hole CH1. The data lower electrode 12a and the bias lower electrode 13a each have, for example, a three-layer structure including two titanium (Ti)-made metal films and an aluminum (Al)-made metal film sandwiched therebetween. The data upper electrode 12b and the bias upper electrode 13b are formed of, for example, ITO.

A third inorganic insulating film 107 is formed on the first planarizing film 106 so as to cover the data lines 12 and the bias line 13. The third inorganic insulating film 107 is a passivation film (protective film). The third inorganic insulating film 107 is formed as an inorganic insulating film and made of silicon nitride ($SiN_x$) or silicon dioxide ($SiO_2$).

A third planarizing film 108 is formed so as to cover the third inorganic insulating film 107. The third planarizing film 108 planarizes a portion above the data lines 12 and the bias line 13. The third planarizing film 108 is formed of, for example, the same material as the material of the second planarizing film 104 (an organic insulating film).

<Structure of Portion Near Cut Surface>

Figure 4:
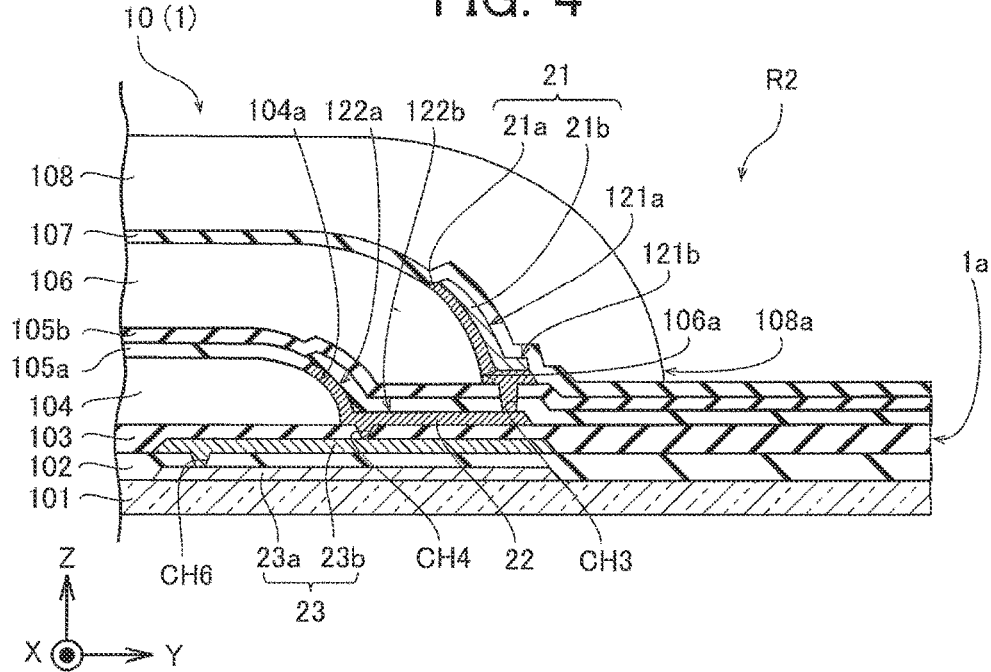
FIG. 4 is a cross-sectional view of the active matrix substrate in a portion (outer portion) near a cut surface away from the pixel region.

FIG. 4 is a cross-sectional view of a portion of the active matrix substrate 1 that is near a cut surface 1a (a portion R2 near the cut surface), and the cross-sectional view is taken along line 1000-1000 in FIG. 2. The cut surface 1a is a surface at which active matrix substrates adjacent to each other are cut off from each other when the active matrix substrates 1 are produced. As shown in FIGS. 3 and 4, in the first embodiment, the first planarizing film 106, the second planarizing film 104, and the third planarizing film 108 are disposed in the active matrix substrate 1 so as to extend from the pixel region R1 to the portion R2 that is near the cut surface and is an outer portion located on the cut surface 1a side of the pixel region R1. An end portion 106a of the first planarizing film 106 that is located on the cut surface 1a side is located at a position inward of the cut surface 1a. In this structure, the first planarizing film 106, the second planarizing film 104, and the third planarizing film 108 are not disposed at the cut surface 1a, so that the thickness of the cut surface 1a can be reduced. Therefore, in the step of cutting the active matrix substrates 1, the active matrix substrates 1 can be easily cut, and the yield of the active matrix substrates 1 can be improved.

An end portion 104a of the second planarizing film 104 that is located on the cut surface 1a side is located inward of the cut surface 1a. An end portion 108a of the third planarizing film 108 that is located on the cut surface 1a side is located inward of the cut surface 1a. As shown in FIG. 4, the end portions 104a, 106a, and 108a are arranged in this order in the Y direction.

As shown in FIG. 4, in the first embodiment, a first conductive portion 21, a second conductive portion 22, and a shield wiring line 23 are disposed in the portion R2 near the cut surface of the active matrix substrate 1. The first conductive portion 21 is formed in the same layer as the layer in which the bias line 13 is formed. Specifically, the first conductive portion 21 includes a first lower conductive portion 21a formed in the same layer as the layer in which the bias lower electrodes 13a are formed and a first upper conductive portion 21b formed in the same layer as the layer in which the bias upper electrodes 13b are formed. The first lower conductive portion 21a is formed of the same material as the material of the bias lower electrodes 13a. The first upper conductive portion 21b is formed of the same material as the material of the bias upper electrodes 13b. The second conductive portion 22 is formed in the same layer as the layer in which the connection electrodes 16a are formed and made of the same material as the material of the connection electrodes 16a. Specifically, the second conductive portion 22 is formed in the layer lower than the first conductive portion 21.

The shield wiring line 23 is formed in the same layer as the layer in which the thin film transistors 15 are formed. In this case, the number of steps for fabricating the X-ray imaging panel 10 can be smaller than that when an additional step is added to form the shield wiring line 23. The shield wiring line 23 is formed in the layer lower than the first conductive portion 21 and the second conductive portion 22. More specifically, the shield wiring line 23 includes a shield lower wiring line 23a formed in the same layer as the layer in which the gate electrodes 15a are formed and a shield upper wiring line 23b formed in the same layer as the layer in which the source electrodes 15c are formed. The shield lower wiring line 23a is formed of the same material as the material of the gate electrodes 15a. The shield upper wiring line 23b is formed of the same material as the material of the source electrodes 15c. A contact hole CH6 is formed in the gate insulating film 102 at a position in the portion R2 near the cut surface. Part of the shield upper wiring line 23b is formed in the contact hole CH6. The shield upper wiring line 23b and the shield lower wiring line 23a are connected to each other in the contact hole CH6.

As shown in FIG. 4, the shield wiring line 23 is electrically connected to the first conductive portion 21 and the second conductive portion 22. Specifically, a contact hole CH3 is formed in the first inorganic insulating film 105a and the second inorganic insulating film 105b at a position in the portion R2 near the cut surface. Moreover, a contact hole CH4 is formed in the protective film 103 at a position in the portion R2 near the cut surface. The first conductive portion 21 is formed so as to extend from the end portion 106a of the first planarizing film 106 to the upper surface of the second inorganic insulating film 105b and into the contact hole CH3. Specifically, the first conductive portion 21 includes a portion 121a formed on the end portion 106a of the first planarizing film 106 and a portion 121b formed on the upper surface of the second inorganic insulating film 105b and extending into the contact hole CH3. The second conductive portion 22 is formed so as to extend from the end portion 104a of the second planarizing film 104 to the upper surface of the protective film 103 and into the contact hole CH4. Specifically, the second conductive portion 22 includes a portion 122a formed on the end portion 104a of the second planarizing film 104 and a portion 122b formed on the upper surface of the protective film 103 and extending into the contact hole CH4. The first conductive portion 21 and the second conductive portion 22 are connected to each other in the contact hole CH3. The second conductive portion 22 and the shield wiring line 23 are connected to each other in the contact hole CH4.

In the above structure, steps may be formed in the first planarizing film 106 and the second planarizing film 104 at positions in the portion R2 near the cut surface of the active matrix substrate 1. However, during a dry etching step described later, the steps are free from a small amount of metal remaining thereon, and removal of metal at unintended timing may not occur because the first conductive portion 21 and the second conductive portion 22 are formed in the portion R2 near the cut surface. Therefore, the occurrence of anomalous discharge can be reduced. Moreover, since the first conductive portion 21 and the second conductive portion 22 are connected to the shield wiring line 23, the combined capacitance of the first conductive portion 21, the second conductive portion 22, and the shield wiring line 23 can be larger than the capacitance of the first conductive portion 21. In this case, sudden variations in the potentials of the first conductive portion 21, the second conductive portion 22, and the shield wiring line 23 may not occur, so that the occurrence of anomalous discharge can be reduced more effectively. Therefore, the occurrence of anomalous discharge is reduced, and damage to the bias line 13 and the photodiodes 16 in the active matrix substrate 1 can be reduced. Even when the second planarizing film 104 is disposed in the active matrix substrate 1, the second conductive portion 22 reduces the occurrence of anomalous discharge, and damage to the connection electrodes 16a and the thin film transistors 15 in the active matrix substrate 1 can be reduced.

As shown in FIG. 2, the shield wiring line 23 is connected to a ground (GND) with a reference potential. The reference potential is, for example, a ground potential. In this structure, the potentials of the first conductive portion 21, the second conductive portion 22, and the shield wiring line 23 are not in a floating state during the operation of the X-ray imaging panel 10, so that the influence of the potentials of the first conductive portion 21, the second conductive portion 22, and the shield wiring line 23 on the performance of the X-ray imaging panel 10 can be reduced.

<Structure of Portion Between Pixel Region and Terminal Region>

As shown in FIG. 2, gate terminals 31 connected to the respective gate lines 11 are disposed in the active matrix substrate 1 in a direction (X direction) in which the gate lines 11 extend from the pixel region R1. Data terminals 32 connected to the respective data lines 12 are disposed in the active matrix substrate 1 in a direction in which the data lines 12 extend from the pixel region R1. A bias terminal 33 connected to the bias line 13 is disposed in the active matrix substrate 1 at a position adjacent to the data terminals 32. A region of the active matrix substrate 1 in which the plurality of gate terminals 31, the plurality of data terminals 32, and the bias terminal 33 are disposed is referred to as a terminal region R3.

ESD (Electro-Static Discharge) protection elements 31a, 32a, and 33a are disposed in the terminal region R3. The ESD protection elements 31a are connected to the respective gate lines 11 and configured to dissipate static electricity through the plurality of gate lines 11. The ESD protection elements 32a are connected to the respective data lines 12 and to the ground (GND) and configured such that static electricity entering the data lines 12 is dissipated to the ground. The ESD protection element 33a is connected to the bias line 13 and the ground (GND) and configured such that static electricity entering the bias line 13 is dissipated to the ground.

Figure 5:
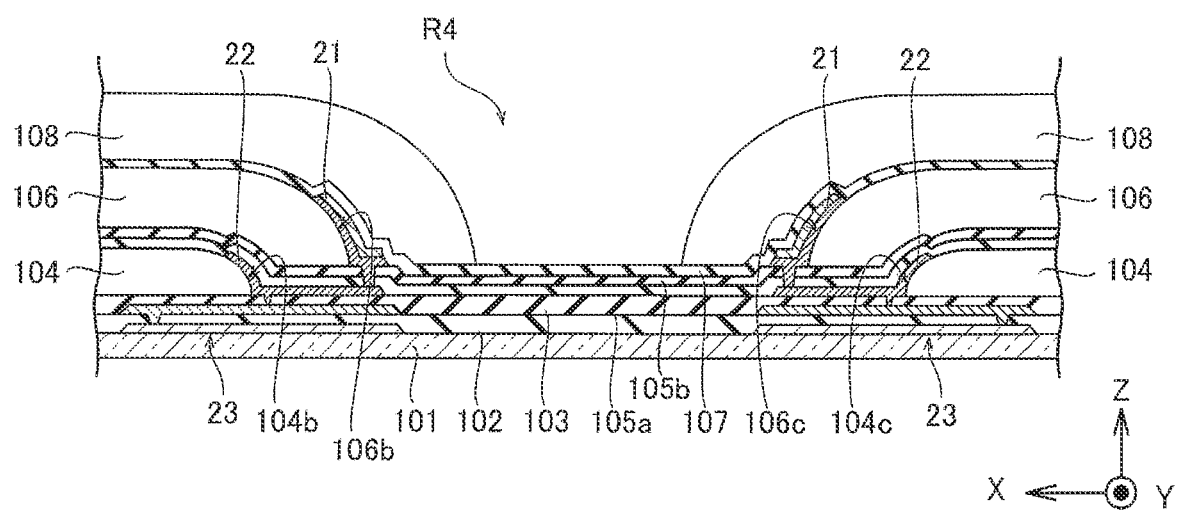
FIG. 5 is a cross-sectional view of the active matrix substrate in a boundary portion (outer portion) between the pixel region and a terminal region.

FIG. 5 is a cross-sectional view of the active matrix substrate 1 in a boundary portion R4 between the pixel region R1 and the terminal region R3, and the cross-sectional view is taken along line 1100-1100 in FIG. 2. As shown in FIG. 5, a groove portion in which the first planarizing film 106, the second planarizing film 104, and the third planarizing film 108 are not disposed is formed in the boundary portion R4 between the pixel region R1 and the terminal region R3 so as to extend in a direction (outward direction) from the pixel region R1 toward the terminal region R3. The boundary portion R4 is one of the "outer portions" outside the pixel region R1. In this structure, moisture entering the terminal region R3 from the gate terminals 31, the data terminals 32, the bias terminal 33, and the ESD protection elements 31a, 32a, and 33a do not enter the pixel region R1 through the first planarizing film 106, the second planarizing film 104, or the third planarizing film 108.

In the boundary portion R4, first conductive portions 21 are disposed on respective end portions 106b and 106c of two first planarizing films 106 facing each other. In the boundary portion R4, second conductive portions 22 are disposed on respective end portions 104b and 104c of two second planarizing films 104 facing each other. The first conductive portions 21 and the second conductive portions 22 disposed near the boundary portion R4 are connected to the shield wiring line 23. In this case, anomalous discharge may not occur during the fabrication of the X-ray imaging panel 10 not only in a portion near the cut surface 1a of the active matrix substrate 1 (the portion R2 near the cut surface) but also in the boundary portion R4 in which steps of the first planarizing films 106 and steps of the second planarizing films 104 are formed.

(Method for Fabricating X-Ray Imaging Panel)

Figure 6:
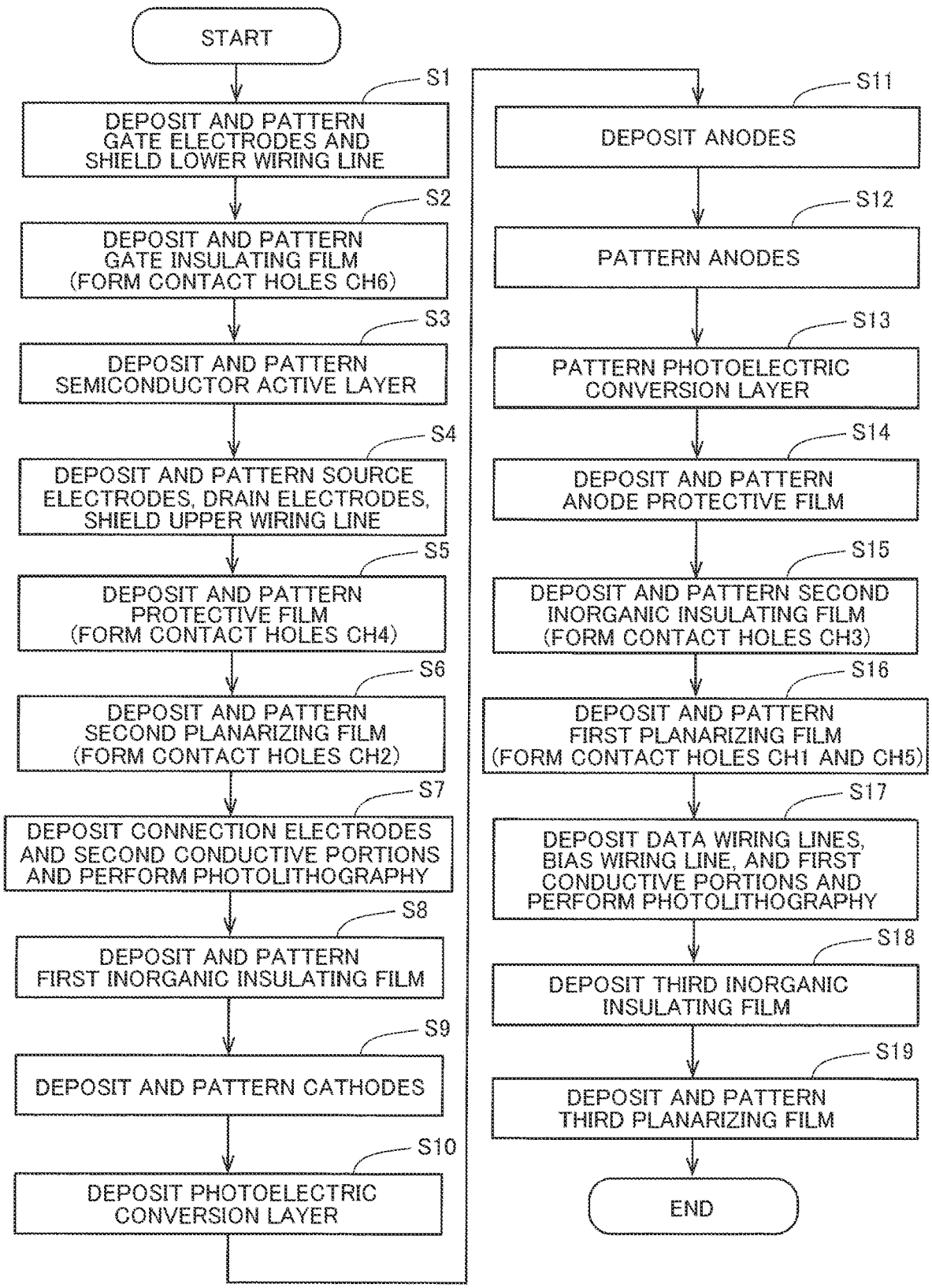
FIG. 6 is a flowchart showing a process for fabricating an X-ray imaging panel in the first embodiment.

Referring next to FIG. 6, a method for fabricating the X-ray imaging panel 10 (the active matrix substrate 1) in the first embodiment will be described. FIG. 6 is a flowchart showing a process for fabricating the X-ray imaging panel 10.

As shown in FIG. 6, step S1 is first performed. Specifically, in the pixel region R1, the gate electrodes 15a (see FIG. 3) are deposited on the substrate 101 and patterned. Moreover, in the portion R2 near the cut surface and the boundary portion R4, the shield lower wiring line 23a (see FIG. 4) is deposited on the substrate 101 and patterned. Specifically, the shield lower wiring line 23a is formed in the same layer as the layer in which the gate electrodes 15a are formed. Although not illustrated, the gate lines 11 are formed integrally with the gate electrodes 15a when the gate electrodes 15a are deposited.

In step S2, the gate insulating film 102 is deposited so as to cover the gate electrodes 15a and the shield lower wiring line 23a and then patterned. In step S2, the contact holes CH6 (see FIG. 4) are formed in the gate insulating film 102 at positions in the portion R2 near the cut surface and the boundary portion R4. Then step S3 is performed. Specifically, in the pixel region R1, the semiconductor active layer 15b (see FIG. 3) is formed on the gate insulating film 102 and patterned.

Then step S4 is performed. Specifically, in the pixel region R1, the source electrodes 15c and the drain electrodes 15d are formed on the gate insulating film 102 and patterned. The thin film transistors 15 are thereby formed. Moreover, in the portion R2 near the cut surface and the boundary portion R4, the shield upper wiring line 23b is formed on the gate insulating film 102 and in the contact holes CH6. Specifically, the source electrodes 15c, the drain electrodes 15d, and the shield upper wiring line 23b are formed in the same layer.

Then step S5 is performed. Specifically, in the pixel region R1, the protective film 103 is formed on the gate insulating film 102 so as to cover the source electrodes 15c and the drain electrodes 15d and patterned. In step S5, the contact holes CH4 (see FIG. 4) are formed in the protective film 103 at positions in the portion R2 near the cut surface and the boundary portion R4. In step S6, the second planarizing film 104 is deposited on the protective film 103. The second planarizing film 104 in the pixel region R1 is formed so as to extend from the pixel region R1 to the portion R2 (see FIG. 4) near the cut surface and to the boundary portion R4 (see FIG. 5). In step S6, the contact holes CH2 (see FIG. 3) are formed in the second planarizing film 104 at positions in the pixel region R1.

Then step S7 is performed. Specifically, in the pixel region R1, the connection electrodes 16a are deposited on the second planarizing film 104 and in the contact holes CH2 and then patterned. In this manner, the connection electrodes 16a are connected to the respective drain electrodes 15d. Moreover, in the portion R2 near the cut surface and the boundary portion R4, the second conductive portion 22 is formed so as to extend from the end portions 104a and 104b of the second planarizing film 104 to portions on the protective film 103 and into the contact holes CH4 and then patterned by photolithography.

Figure 7:
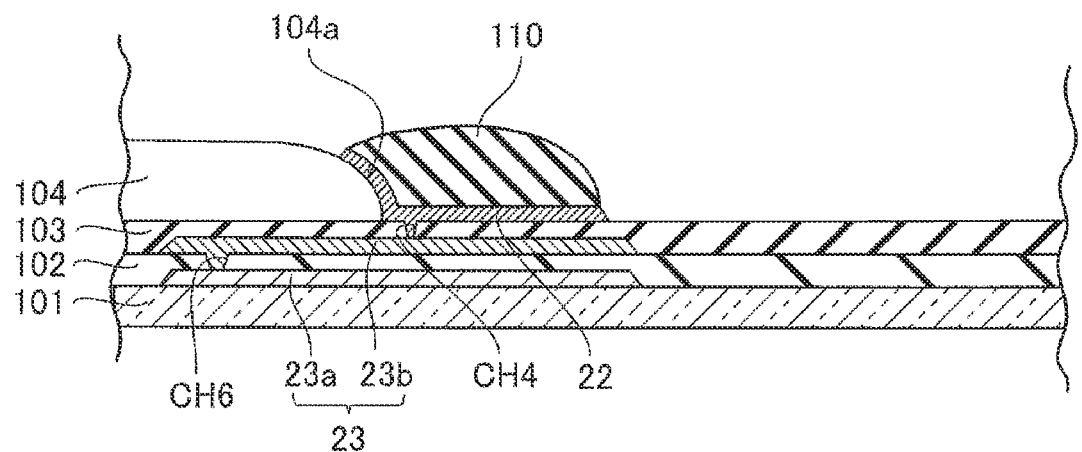
FIG. 7 is an illustration showing the process of forming a second conductive portion.

FIG. 7 is an illustration for describing the formation of the second conductive portion 22. A film that later becomes the connection electrodes 16a and the second conductive portion 22 is formed on the second planarizing film 104 and the protective film 103 and in the contact holes CH2 and the contact holes CH4. Then a resist 110 is applied so as to cover the film that later becomes the connection electrodes 16a and the second conductive portion 22. Then portions other than portions that later become the connection electrodes 16a and the second conductive portion 22 are exposed to light through a mask, and part of the resist 110 is removed. Then, as shown in FIG. 7, dry etching is performed to remove the film in portions in which the resist 110 is not present. The dry etching performed may be, for example, anisotropic etching. Then the resist 110 is removed. The connection electrodes 16a are thereby formed in the pixel region R1, and the second conductive portion 22 is formed in the portion R2 near the cut surface and the boundary portion R4. The second conductive portion 22 is formed so as to extend from the end portions 104a and 104b of the second planarizing film 104 to portions on the protective film 103 and into the contact holes CH4.

As show in FIG. 6, in step S8, the first inorganic insulating film 105a is deposited so as to cover the connection electrodes 16a and the second conductive portion 22. More specifically, the first inorganic insulating film 105a is deposited so as to cover part of upper portions of the connection electrodes 16a and fill the contact holes CH2. Then step S9 is performed. Specifically, in the pixel region R1, the cathodes 16b (see FIG. 3) of the photodiodes 16 are formed on part of the first inorganic insulating film 105a and on the connection electrodes 16a and then patterned.

Then step S10 is performed. In the pixel region R1, the photoelectric conversion layer 17 (see FIG. 3) is deposited. Specifically, the n-type amorphous semiconductor layer 171, the intrinsic amorphous semiconductor layer 172, and the p-type amorphous semiconductor layer 173 are stacked in this order. Then, in step S11, the anodes 16c are deposited. In step S12, the anodes 16c are patterned. In step S13, the photoelectric conversion layer 17 is patterned. In step 314, the anode protective film 16d is deposited so as to cover the anodes 16c and patterned. The photodiodes 16 (see FIG. 3) are thereby formed in the pixel region R1.

In step S15, the second inorganic insulating film 105b is deposited so as to cover the photodiodes 16 and at least part of the first inorganic insulating film 105a and then patterned. In step S15, the contact holes CH3 (see FIG. 4) are formed in the first inorganic insulating film 105a and the second inorganic insulating film 105b at positions in the portion R2 near the cut surface and the boundary portion R4.

In step S16, the first planarizing film 106 is deposited so as to cover the second inorganic insulating film 105b and patterned. The first planarizing film 106 is formed so as to extend from the pixel region R1 to the portion R2 near the cut surface and to the boundary portion R4. In the pixel region R1, the contact holes CH1 and CH5 (see FIG. 3) are formed in the first planarizing film 106.

In step S17, a film that later becomes the data lower electrodes 12a, the bias lower electrodes 13a, and the first lower conductive portion 21a is deposited on the first planarizing film 106, and a film that later becomes the data upper electrodes 12b, the bias upper electrodes 13b, and the first upper conductive portion 21b is formed on the film that later becomes the data lower electrodes 12a, the bias lower electrodes 13a, and the first lower conductive portion 21a. Then photolithography including a dry etching step is performed in the same manner as the step for forming the second conductive portion 22 shown in FIG. 7 to form the data lower electrodes 12a, the bias lower electrodes 13a, the first lower conductive portion 21a, the data upper electrodes 12b, the bias upper electrodes 13b, and the first upper conductive portion 21b. The data lines 12 and the bias line 13 (see FIG. 3) are thereby formed in the pixel region R1, and the first conductive portion 21 (see FIG. 4) is formed in the portion R2 near the cut surface and the boundary portion R4. The first conductive portion 21 is formed so as to extend from the end portions 106a and 106b of the first planarizing film 106 to the upper surface of the second inorganic insulating film 105b and into the contact holes CH3.

In step S18, the third inorganic insulating film 107 is formed on the first planarizing film 106 so as to cover the data lines 12 and the bias line 13 and patterned. In step S19, the third planarizing film 108 is deposited so as to cover the third inorganic insulating film 107 and patterned. Then the active matrix substrate 1 is cut, whereby the active matrix substrate 1 is completed. Then the active matrix substrate 1 is combined with the scintillator 2, and the X-ray imaging panel 10 is thereby completed.

With the above method, even when steps are formed in the first planarizing film 106 and the second planarizing film 104 within the portion R2 near the cut surface and the boundary portion R4 of the active matrix substrate 1, the occurrence of anomalous discharge is reduced, and therefore damage to the wiring lines and element in the active matrix substrate 1 may not occur.

Second Embodiment

Figure 8:
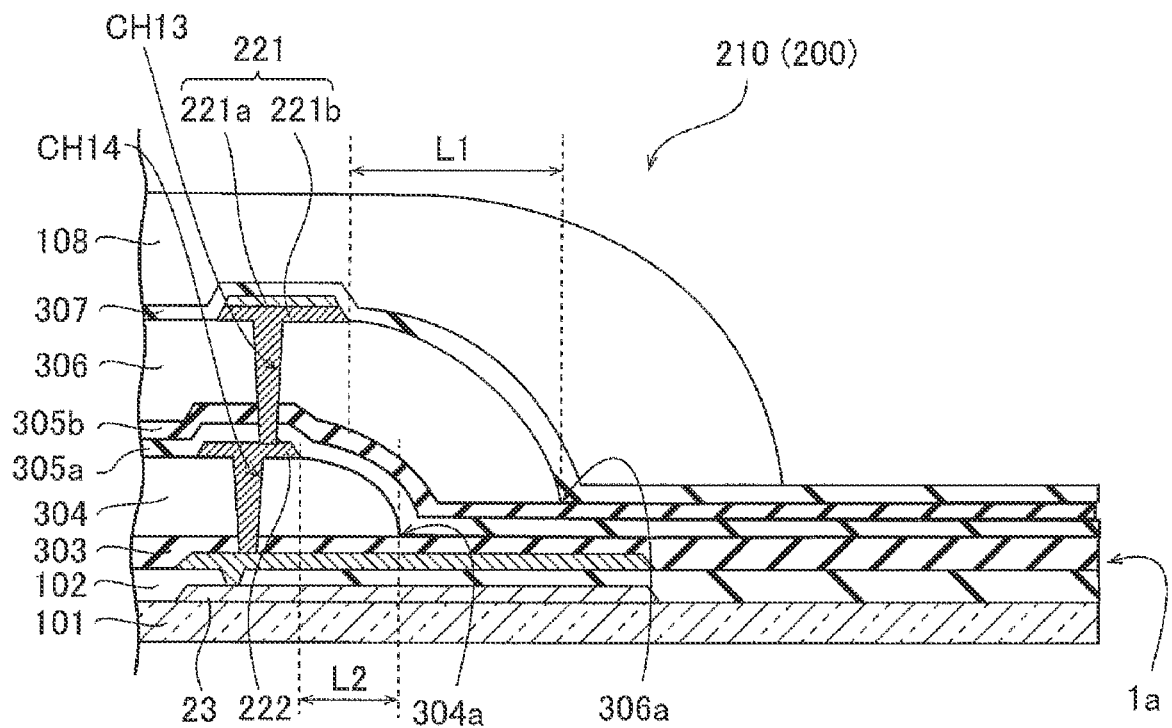
FIG. 8 is an illustration showing the structure of an X-ray imaging device according to a second embodiment.

Referring to FIG. 8, the structure of an X-ray imaging device 200 (X-ray imaging panel 210) in a second embodiment will be described. FIG. 8 shows the structure of a boundary portion of the X-ray imaging panel 210 of the X-ray imaging device 200 in the second embodiment and a portion near its cut surface. In the second embodiment, a first conductive portion 221 is not provided in an end portion 306a of a first planarizing film 306 but is formed within a prescribed range from an end portion 304a. The same components as those in the first embodiment will be denoted by the same symbols, and their description will be omitted.
(Structure of Second Embodiment)

As shown in FIG. 8, the X-ray imaging panel 210 includes the first conductive portion 221, a second conductive portion 222, a protective film 303, a first planarizing film 306, a first inorganic insulating film 305a, a second inorganic insulating film 305b, a second planarizing film 304, and a third inorganic insulating film 307. Part of the second conductive portion 222 is disposed in the protective film 303 and the second planarizing film 304, and a contact hole CH14 for connecting the shield wiring line 23 to the second conductive portion 222 is formed in the protective film 303 and the second planarizing film 304. Part of the first conductive portion 221 is disposed in the first inorganic insulating film 305a, the second inorganic insulating film 305b, and the first planarizing film 306, and a contact hole CH13 for connecting the first conductive portion 221 to the second conductive portion 222 is formed in the first inorganic insulating film 305a, the second inorganic insulating film 305b, and the first planarizing film 306. In this manner, the first conductive portion 221, the second conductive portion 222, and the shield wiring line 23 are electrically connected to each other.

In the second embodiment, at least part of the first conductive portion 221 is formed on the first planarizing film 306 within a prescribed range from the end portion 306a of the first planarizing film 306. The term "within a prescribed range" means, for example, within about 20 μm, and the distance L1 between the first conductive portion 221 and the end portion 306a is about 20 μm or less. At least part of the second conductive portion 222 is formed on the second planarizing film 304 within a prescribed range from the end portion 304a of the second planarizing film 304. The term "within a prescribed range" in this case means also, for example, within about 20 μm, and the distance L2 between the second conductive portion 222 and the end portion 304a is about 20 μm or less. The rest of the structure in the second embodiment is the same as that in the first embodiment.

In the portion near the cut surface of the active matrix substrate and the boundary portion, steps may be formed in the first planarizing film 306 and the second planarizing film 304. However, in the structure of the second embodiment, the first conductive portion 221 and the second conductive portion 222 are formed. Therefore, even when anomalous discharge occurs at the steps, the anomalous discharge propagates to the first conductive portion 221 and the second conductive portion 222 and does not propagate to the wiring lines and elements in the pixel region R1, so that damage to the wiring lines and elements in the pixel region R1 may not occur.

(Fabrication Method in Second Embodiment)

Figure 9:
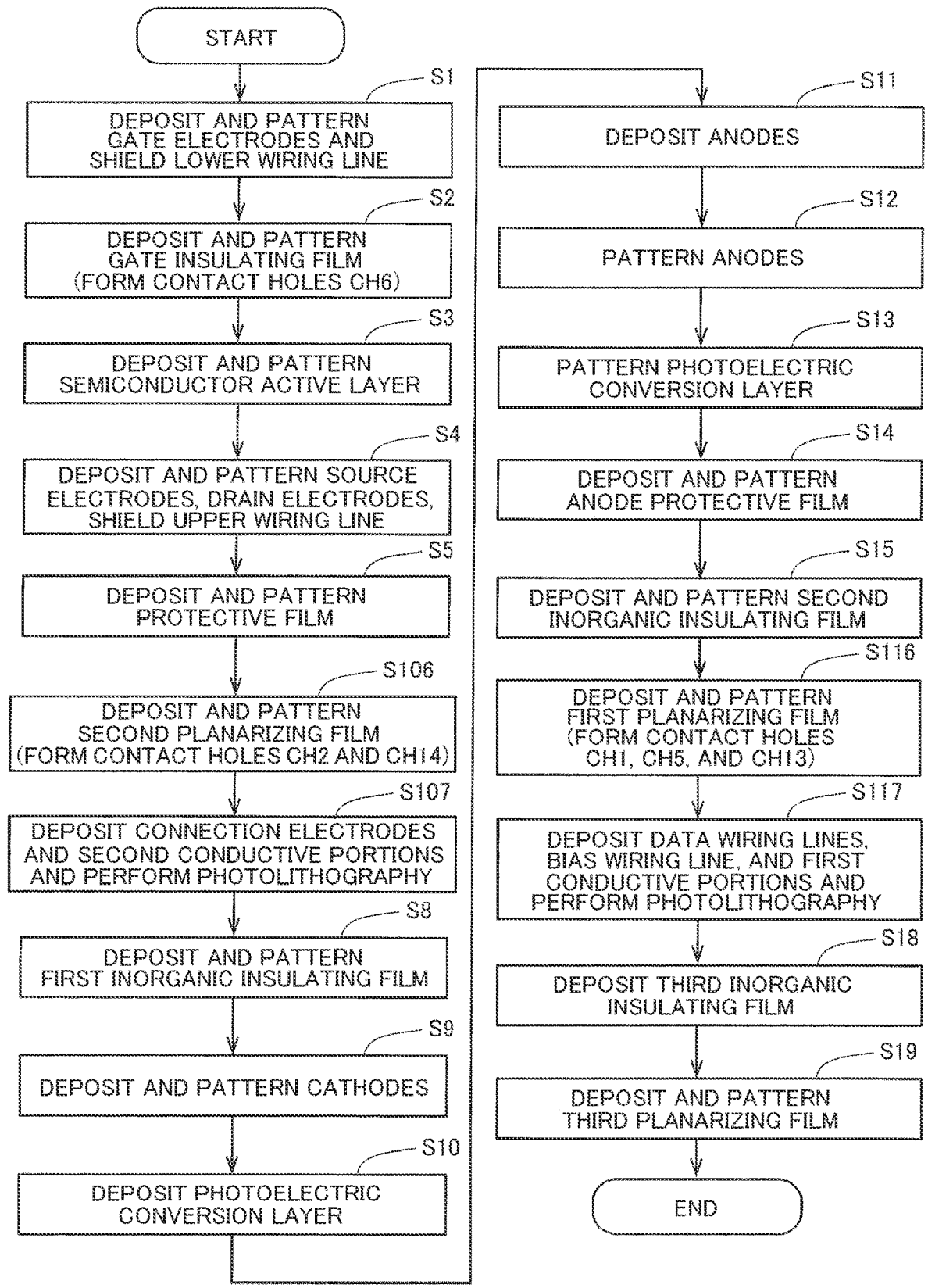
FIG. 9 is a flowchart showing a process for fabricating an X-ray imaging panel in the second embodiment.

Referring next to FIG. 9, a method for fabricating the X-ray imaging panel 210 in the second embodiment will be described. FIG. 9 is a flowchart showing a process for fabricating the X-ray imaging panel 210 in the second embodiment. The same fabrication steps as those in the first embodiment are denoted by the same symbols, and their description will be omitted.

As shown in FIG. 9, in step S106 performed after step S5, the second planarizing film 304 is formed and patterned. In step S106, the contact hole CH14 is formed in the protective film 303 and the second planarizing film 304. In step S107, the second conductive portion 222 is formed.

In step S116 performed after step S15, the first planarizing film 306 is formed and patterned. In step S116, the contact hole CH13 is formed in the first inorganic insulating film 305a, the second inorganic insulating film 305b, and the first planarizing film 306. In step S117, the first conductive portion 221 is formed.

With the fabrication method in the second embodiment also, anomalous discharge does not propagate to the wiring lines and elements in the pixel region, so that damage to the wiring lines and elements may not occur.

[Modifications]

The embodiments have been described. However, the above-described embodiments are merely examples for embodying the present disclosure. Therefore, the present disclosure is not limited to the above-described embodiments, and the embodiments can be appropriately modified so long as they do not depart from the scope of the disclosure.

(1) In the examples shown in the first and second embodiments, the shield wiring line is connected to the ground, but the present disclosure is not limited thereto. Specifically, the shield wiring line may be in a floating state.

(2) In the examples shown in the first and second embodiments, the first conductive portion and the second conductive portion are formed in the active matrix substrate including the first planarizing film and the second planarizing film, but the present disclosure is not limited thereto. For example, the first conductive portion may be formed in an active matrix substrate including no second planarizing film without forming the second conductive portion.

(3) In the examples shown in the first and second embodiments, the shield wiring line is formed in the same layer as the layer in which part of the thin film transistors are formed, but the present disclosure is not limited thereto. Specifically, the shield wiring line may be formed in a layer different from the layer in which the thin film transistors are formed.

(4) In the examples shown in the first and second embodiments, the first conductive portion is connected to the shield wiring line through the second conductive portion, but the present disclosure is not limited thereto. Specifically, the first conductive portion may be connected directly to the shield wiring line through a contact hole.

(5) In the examples shown in the first and second embodiments, the first conductive portion and the second conductive portion are disposed in both the portion near the cut surface and the boundary portion, but the present disclosure is not limited thereto. Specifically, at least one of the first conductive portion and the second conductive portion may be disposed in only one of the portion near the cut surface and the boundary portion.

(6) In the examples shown in the first and second embodiments, the boundary portion (groove portion) is provided in the active matrix substrate, but the present disclosure is not limited thereto. Specifically, the planarizing film may be formed continuously from the pixel region to the terminal region.

(7) In the example shown in the second embodiment, the distance L1 between the end portion of the first planarizing film to the first conductive portion and the distance L2 from the end portion of the second planarizing film to the second conductive portion are each about 20 μm or less, but the present disclosure is not limited thereto. Specifically, at least one of the distances L1 and L2 may be larger than about 20 μm.

The above-described X-ray imaging panels and the above-described X-ray imaging panel fabrication methods can also be described as follows.

An X-ray imaging panel according to a first configuration includes: an active matrix substrate having a pixel region including a plurality of pixels; and a scintillator that converts X-rays projected onto the X-ray imaging panel to scintillation light, wherein the plurality of pixels include respective photoelectric conversion elements, wherein the active matrix substrate further includes a first planarizing film that covers the photoelectric conversion elements, is formed from an organic resin film, and has a plurality of first contact holes and a first wiring line that is formed in the first contact holes and in a layer upper than the first planarizing film and connected to the photoelectric conversion elements within the first contact holes, wherein the first planarizing film is disposed in the active matrix substrate so as to extend to an outer portion outside the pixel region, and wherein the active matrix substrate further includes, in the outer portion, a first conductive portion formed in the same layer as the layer in which the first wiring line is formed and a second wiring line disposed in a layer lower than the first conductive portion and connected to the first conductive portion (a first configuration).

In the first configuration, steps may be formed in the first planarizing film and the second planarizing film at positions in the outer portion of the active matrix substrate. However, during the dry etching step, the steps are free from a small amount of metal remaining thereon, and removal of metal at unintended timing may not occur because the first conductive portion and the second conductive portion are formed in the step portions. Therefore, the occurrence of anomalous discharge can be reduced. Since the first conductive portion is connected to the second wiring line, the combined capacitance of the first conductive portion and the second wiring line can be larger than the capacitance of the first conductive portion. In this case, sudden variations in the potentials of the first conductive portion and the second wiring line may not occur, so that the occurrence of anomalous discharge can be reduced more effectively. Therefore, the occurrence of anomalous discharge is reduced, and damage to the wiring line and the elements in the active matrix substrate 1 can be reduced. Even when the first conductive portion is not formed directly on a step portion, anomalous discharge occurring in the step portion propagates to the first conductive portion formed in the outer portion near the step portion. In this case, the anomalous discharge does not propagate to the wiring line and the elements in the pixel region, and the damage to the wiring line and the elements in the pixel region may not occur.

In the first configuration, the second wiring line may be connected to a ground with a reference potential (a second configuration).

In the second configuration, the potential of the first conductive portion and the potential of the second wiring line are not in a floating state during the use of the X-ray imaging panel. Therefore, the influence of the potential of the first conductive portion and the potential of the second wiring line on the performance of the X-ray imaging panel can be reduced.

In the first or second configuration, the active matrix substrate may further include: a plurality of thin film transistors; and a second planarizing film that covers the thin film transistors, is formed from an organic resin film, and has a plurality of second contact holes, wherein each of the photoelectric conversion elements may include a connection electrode that is formed in a layer upper than the second planarizing film and in a corresponding one of the second contact holes and connected to a corresponding one of the thin film transistors within the corresponding one of the second contact holes, wherein the second planarizing film may be formed in the active matrix substrate so as to extend from the pixel region to the outer portion, and wherein the active matrix substrate may further include, in the outer portion, a second conductive portion formed in the same layer as the layer in which the connection electrode is formed (a third configuration).

In the third configuration, although the second planarizing film is disposed in the active matrix substrate, damage to the connection electrodes and the thin film transistors in the active matrix substrate due to the occurrence of anomalous discharge may not occur.

In the third configuration, each of the thin film transistors may include a gate electrode and a source electrode, and the second wiring line may be formed in the same layer as a layer in which at least one of the gate electrode and the source electrode is formed (a fourth configuration).

In the fourth configuration, the number of steps for fabricating the X-ray imaging panel is smaller than that when an additional step of forming the second wiring line is provided.

In the third or fourth configuration, the active matrix substrate may further include an inorganic insulating film that is formed in a layer upper than the photoelectric conversion elements and lower than the first planarizing film and has a third contact hole formed in the outer portion. The first conductive portion may be formed so as to extend outward from an outer end portion of the first planarizing film to an upper surface of the inorganic insulating film and into the third contact hole, and the second conductive portion may be connected to the first conductive portion formed in the third contact hole (a fifth configuration).

In the fifth configuration, since the first conductive portion can be electrically connected to the second conductive portion, sudden variations in the potentials of the first conductive portion and the second conductive portion may not occur. Therefore, anomalous discharge may not occur when the first wiring line is formed.

In any one of the third to fifth configurations, the active matrix substrate may further include a protective film that covers the thin film transistors and has a fourth contact hole formed in the outer portion. The second conductive portion may be formed so as to extend outward from an outer end portion of the second planarizing film to an upper surface of the protective film and into the fourth contact hole, and the second wiring line may be connected to the second conductive portion formed in the fourth contact hole (a sixth configuration).

In the sixth configuration, since the first conductive portion, the second conductive portion, and the second wiring line can be electrically connected to each other, sudden variations in the potentials of the first conductive portion, the second conductive portion, and the second wiring line may not occur. Therefore, anomalous discharge may not occur when the first wiring line or the connection electrodes are formed.

In any one of the first to sixth configurations, the active matrix substrate may further include a group of terminals to which a gate signal or a source signal is to be supplied, and the outer portion may include a boundary portion between the pixel region and a terminal region of the active matrix substrate in which the group of terminals is formed (a seventh configuration).

In the seventh configuration, damage to the connection electrodes and the thin film transistors in the active matrix substrate due to the occurrence of anomalous discharge during the fabrication of the X-ray imaging panel may not occur not only in the vicinity of the cut surface of the active matrix substrate but also in the boundary portion between the pixel region and the terminal region, in which portion a step is formed in the first planarizing film.

An X-ray imaging panel fabrication method according to an eighth configuration is a method for fabricating an X-ray imaging panel that includes an active matrix substrate having a pixel region including a plurality of pixels and a scintillator that converts X-rays projected onto the X-ray imaging panel to scintillation light, the method including: forming a plurality of photoelectric conversion elements in the pixel region; forming a first planarizing film formed from an organic resin film such that the first planarizing film covers the plurality of photoelectric conversion elements and extends from the pixel region to an outer portion outside the pixel region; forming a plurality of first contact holes in the first planarizing film; and forming, in the pixel region, a first wiring line in the first contact holes and in a layer upper than the first planarizing film and forming, in the outer portion, a first conductive portion in the same layer as the layer in which the first wiring line is formed, wherein the forming the first wiring line and the first conductive portion includes performing dry etching by photolithography and further includes forming a second wiring line in a layer lower than the first conductive portion (an eighth configuration).

In the eighth configuration, as in the first configuration, damage to the connection electrode and the thin film transistors in the active matrix substrate due to the occurrence of anomalous discharge may not occur.

The present disclosure contains subject matter related to that disclosed in Japanese Priority Patent Application JP 2021-072763 filed in the Japan Patent Office on Apr. 22, 2021, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An X-ray imaging panel comprising:
an active matrix substrate having a pixel region including a plurality of pixels; and
a scintillator that converts X-rays projected onto the X-ray imaging panel to scintillation light, wherein the plurality of pixels include respective photoelectric conversion elements, wherein the active matrix substrate further includes a first planarizing film that covers the photoelectric conversion elements, is formed from an organic resin film, and has a plurality of first contact holes and a first wiring line that is formed in the first contact holes and in a layer upper than the first planarizing film and connected to the photoelectric conversion elements within the first contact holes, wherein the first planarizing film is disposed in the active matrix substrate so as to extend to an outer portion outside the pixel region, and wherein the active matrix substrate further includes, in the outer portion, a first conductive portion formed in the same layer as the layer in which the first wiring line is formed and a second wiring line disposed in a layer lower than the first conductive portion and connected to the first conductive portion.

2. The X-ray imaging panel according to claim 1, wherein the second wiring line is connected to a ground with a reference potential.

3. The X-ray imaging panel according to claim 1, wherein the active matrix substrate further includes:

a plurality of thin film transistors; and a second planarizing film that covers the thin film transistors, is formed from an organic resin film, and has a plurality of second contact holes, wherein each of the photoelectric conversion elements includes a connection electrode that is formed in a layer upper than the second planarizing film and in a corresponding one of the second contact holes and connected to a corresponding one of the thin film transistors within the corresponding one of the second contact holes, wherein the second planarizing film is formed in the active matrix substrate so as to extend from the pixel region to the outer portion, and wherein the active matrix substrate further includes, in the outer portion, a second conductive portion formed in the same layer as the layer in which the connection electrode is formed.

4. The X-ray imaging panel according to claim 3, wherein each of the thin film transistors includes a gate electrode and a source electrode, and wherein the second wiring line is formed in the same layer as a layer in which at least one of the gate electrode and the source electrode is formed.

5. The X-ray imaging panel according to claim 3, wherein the active matrix substrate further includes an inorganic insulating film that is formed in a layer upper than the photoelectric conversion elements and lower than the first planarizing film and has a third contact hole formed in the outer portion, wherein the first conductive portion is formed so as to extend outward from an outer end portion of the first planarizing film to an upper surface of the inorganic insulating film and into the third contact hole, and wherein the second conductive portion is connected to the first conductive portion formed in the third contact hole.

6. The X-ray imaging panel according to claim 3, wherein the active matrix substrate further includes a protective film that covers the thin film transistors and has a fourth contact hole formed in the outer portion, wherein the second conductive portion is formed so as to extend outward from an outer end portion of the second planarizing film to an upper surface of the protective film and into the fourth contact hole, and wherein the second wiring line is connected to the second conductive portion formed in the fourth contact hole.

7. The X-ray imaging panel according to claim 1, wherein the active matrix substrate further includes a group of terminals to which a gate signal or a source signal is to be supplied, and wherein the outer portion includes a boundary portion between the pixel region and a terminal region of the active matrix substrate in which the group of terminals is formed.

8. A method for fabricating an X-ray imaging panel that includes an active matrix substrate having a pixel region including a plurality of pixels and a scintillator that converts X-rays projected onto the X-ray imaging panel to scintillation light, the method comprising:

forming a plurality of photoelectric conversion elements in the pixel region;

forming a first planarizing film formed from an organic resin film such that the first planarizing film covers the plurality of photoelectric conversion elements and extends from the pixel region to an outer portion outside the pixel region;

forming a plurality of first contact holes in the first planarizing film; and forming, in the pixel region, a first wiring line in the first contact holes and in a layer upper than the first planarizing film and forming, in the outer portion, a first conductive portion in the same layer as the layer in which the first wiring line is formed, wherein the forming the first wiring line and the first conductive portion includes performing dry etching by photolithography and further includes forming a second wiring line in a layer lower than the first conductive portion.

* * * * *